United States Patent
Dinkel et al.

[11] Patent Number: 5,834,829
[45] Date of Patent: Nov. 10, 1998

[54] ENERGY RELIEVING CRACK STOP

[75] Inventors: Bettina A. Dinkel, Wappinger Falls; Pei-Ing Lee, Lagrangeville; Ernest N. Levine, Poughkeepsie, all of N.Y.

[73] Assignees: International Business Machines Corporation, Armonk, N.Y.; Siemens Components, Inc., Cupertino, Calif.

[21] Appl. No.: 706,586

[22] Filed: Sep. 5, 1996

[51] Int. Cl.[6] .................................................. H01L 23/544
[52] U.S. Cl. .......................... 257/620; 257/508; 438/462
[58] Field of Search ..................................... 257/207, 620, 257/508, 666, 777; 437/226, 227, 278

[56] References Cited

U.S. PATENT DOCUMENTS

| | | | |
|---|---|---|---|
| 4,610,079 | 9/1986 | Abe et al. | 29/583 |
| 5,017,512 | 5/1991 | Takagi | 437/227 |
| 5,024,970 | 6/1991 | Mori | 437/226 |
| 5,096,855 | 3/1992 | Vokoun, III et al. | 437/227 |
| 5,217,916 | 6/1993 | Anderson et al. | 437/51 |
| 5,275,958 | 1/1994 | Ishikawa | 437/226 |
| 5,482,887 | 1/1996 | Duinkerke et al. | 437/62 |
| 5,539,223 | 7/1996 | Sugoh et al. | 257/207 |

FOREIGN PATENT DOCUMENTS 4-56250  2/1992  Japan .

*Primary Examiner*—Sara W. Crane
*Assistant Examiner*—Douglas A. Wille
*Attorney, Agent, or Firm*—Schmeiser, Olsen & Watts; Daryl K. Neff

[57] ABSTRACT

An energy relieving, redundant crack stop and the method of producing the same is disclosed. The redundant pattern allows the crack propagating energy that is not absorbed by the first ring of metallization to be absorbed by a second area of metallization and also provides a greater surface area over which the crack producing energy may be spread. The redundant crack stop is produced during the metallization process along with the rest of the wiring of the chip surface and, therefore, no additional production steps are necessary to form the structure.

30 Claims, 3 Drawing Sheets

ENERGY RELIEVING CRACK STOP

BACKGROUND OF THE INVENTION

1. Technical Field

The present invention relates generally to the manufacturing process of integrated circuit chips. More specifically, the present invention relates to an energy relieving crack stop structure to prevent the propagation of cracks during the dicing of wafers into individual chips.

2. Background Art

In order to minimize processing errors, maximize throughput by reducing the amount of time it takes to manufacture a given number of integrated circuit (IC) chips, and ease handling considerations, a large number of IC chips are processed simultaneously on the surface of a wafer before the wafer is cut or "diced" into the individual chips. However, the dicing process may cause cracks in the active or wired areas of the IC chips, thus resulting in chip failure. To reduce the amount of chip failure due to crack propagation during dicing and the resultant device failure, several processes have been developed including: a "free space" crack stop; a dicing channel; removing metal from the dicing channel; using a narrower dicing blade; and implementing an additional inspection process to reject damaged chips.

Many structures have been designed to absorb the energy that allows the crack to propagate. For example, U.S. Pat. No. 5,024,970, issued Jun. 18, 1991 to Mori and assigned to Mitsubishi Denki Kabuhsiki Kaisha, discloses a complex, multistep process including the steps of: defining a channel, kerf or street between the active areas of adjacent chips; etching grooves in an insulative material deposited on the wafer surface; depositing platinum over the resultant surface; sintering the platinum surface to form the silicide wherever the platinum was in contact with the silicon substrate; removing the elemental platinum; depositing a layer of silicon nitride; selectively removing the silicon nitride from the kerf area thereby forming grooves in the silicon under the platinum silicide areas; and dicing the wafer into individual chips. As is readily apparent, this process comprises numerous additional steps after the chip has been metallized and tested as part of the wafer.

A process that would not add additional processing steps, would be simple and inexpensive, and would reliably prevent crack propagation into the active areas of the chips during the dicing process is therefore desirable.

SUMMARY OF THE INVENTION

According to the present invention, there are provided crack stop designs to increase the crack stop performance by a redundant energy relief design. This is preferably performed by a plurality of either metallization lines or channels around the IC chip active area. The redundancy allows the crack propagating energy not absorbed by the outermost line or channel to be absorbed by the next. Additionally, designs have been suggested which allow the energy to be spread out over a greater amount of surface area around the active areas and, therefore, the cracks are less likely to enter the active areas.

It is an advantage of the present invention that the method of manufacturing the lines or channels in the kerf adds no additional processing steps to the manufacturing process of the IC chips.

It is a further advantage of the present invention that the redundant design distributes crack energy more efficiently around a greater area, thereby reducing crack propagation into the device active area.

The foregoing and other features and advantages of the invention will be apparent from the following more particular description of preferred embodiments of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and.

DETAILED DESCRIPTION OF THE EXEMPLARY EMBODIMENTS

Figure 1:
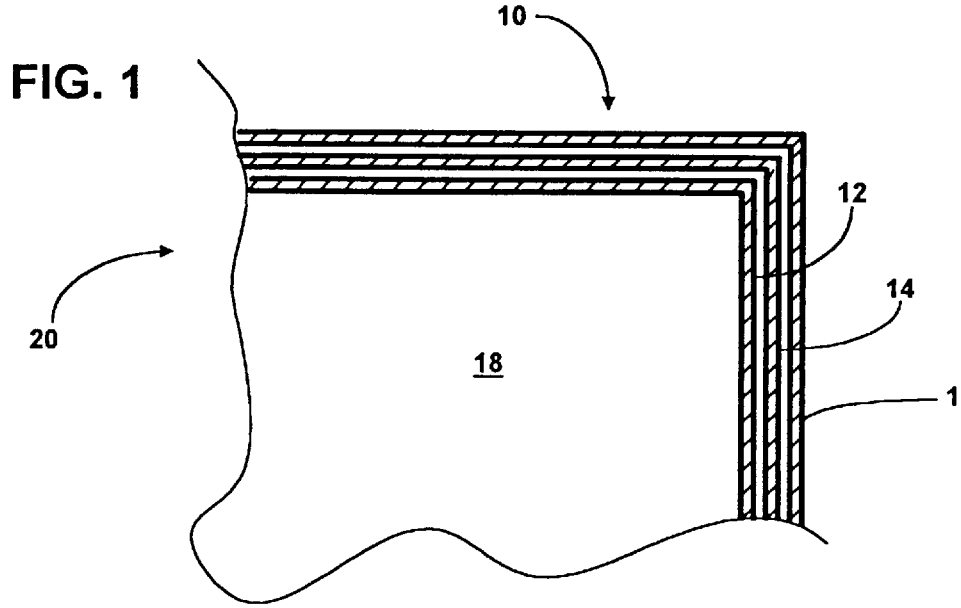
FIG. 1 is a schematic of a first embodiment of the present invention.

In accordance with the present invention, a redundant crack stop design is disclosed. As shown in FIG. 1, the simplest design of an energy relieving crack stop 10 comprises a plurality of metallized rings 12, 14, 16 around an active area 18 of a chip 20. The crack stop 10 is easily manufactured.

In the typical chip manufacturing process, the transistors that make up the logic gates, diodes, etc., are implanted into the chip surface, the gate materials are applied and defined, and an insulative material is deposited over the gated surface and planarized. A series of metallization and contact layers are then utilized to interconnect the various devices on the chip surface. These metallization and contact layers include areas of metallization for electrical connections and areas of passivating or insulative material for electrical isolation. In order to form the necessary electrical connections with the gates, vias or holes are etched into the insulative material to reach the devices and filled with metal. The process by which the vias or holes are selectively etched into the insulative material is typically a photolithographic procedure, followed by a reactive in etch process, both of which are commonly known in the art. The process of depositing the metal into the lines, vias and holes formed by selectively etching these areas can be done in a variety of ways. The most commonly protected today is by depositing Tungsten in a CVD (chemical vapor deposition) tool and polishing away the excess Tungsten using a chemical mechanical polish (CMP) as commonly known in the art. Alternately, one may use electrode deposition processes, i.e., plating or physical sputtering at a hot temperature again followed by a CMP process.

An alternate way of forming a metal line does not involve depositing metal into holes but rather practices depositing a blanket layer of metal and then the excess metal is etched away using a reactive ion etch, known as metal RIE. In all cases one can pattern the configurations described in this invention coincident with the process practiced in the internal chip metallization process.

Thus, the crack stop 10 of the present invention is simply manufactured by altering the areas of metallization to include the lines 12, 14, 16. This is implemented by changing the mask used during the photolithographic processes of the various layers so that the plurality of lines and configurations depicted in FIGS. 1–5 are metallized in at least the contact layer like any other lines or vias of metallization in the various layers on the wafer surface.

The crack stop 10 may only be metallized in the contact layer, which is the first layer of vias and insulative material used to connect the devices to the metallization lines above. The preferred technique for maximum protection is to metallize the crack stop in each layer, forming a continuous vertical barrier of metal configuration. It is also possible that after metalization either in a single contact layer or in a continuous vertical banner that the metallic regions be contacted by a RIE after completion of the chip, followed by etching out these regions with a suitable wet etch. This process ends up with channels free of metal in the configurations shown in FIGS. 1–5, which provide the same energy dissipating function as the metal lines.

In the following Examples, various energy absorbing redundant crack stops have been depicted, however, it is to be recognized that many other structures are possible, the basis of the invention lies in the redundant lines surrounding the active areas of the chips so as to absorb energy at the dicing step of IC chip manufacturing and not in the exact pattern.

EXAMPLE 1

As shown in FIG. 1, a number of parallel lines 12, 14, 16 may be used as the crack stop. The preferred metal pitch is from about 0.7 $\mu$m to about 6 $\mu$m. Whatever crack propagating energy is not absorbed by the first ring of metallization, may then be absorbed by the second or third. This redundancy is therefore helpful in preventing crack propagation into the chip active areas.

EXAMPLE 2

Figure 2:
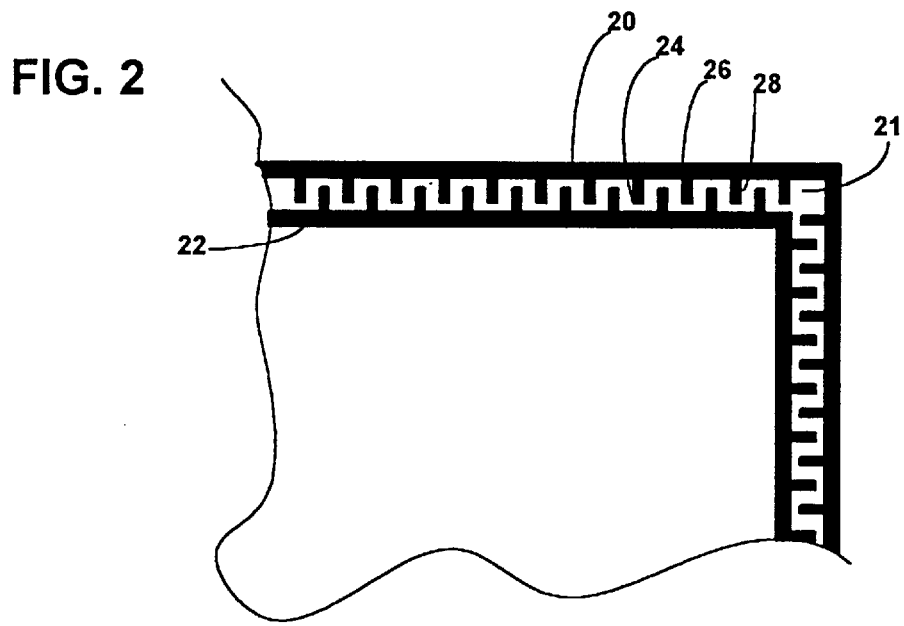
FIG. 2 is a schematic of a second embodiment of the present invention.
Figure 3A:
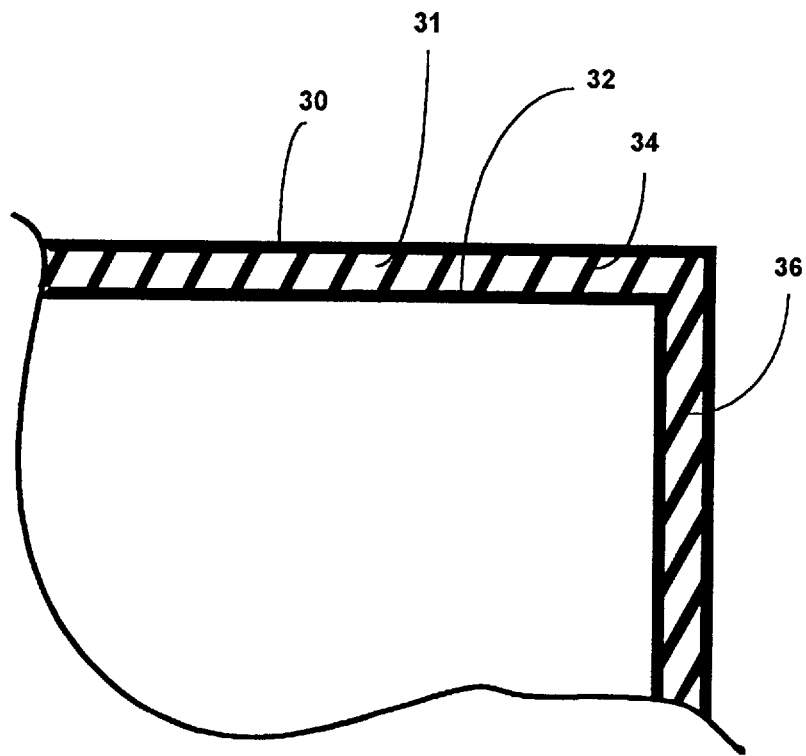
FIGS. 3A and 3B are schematics of a third embodiment of the present invention.
Figure 3B:
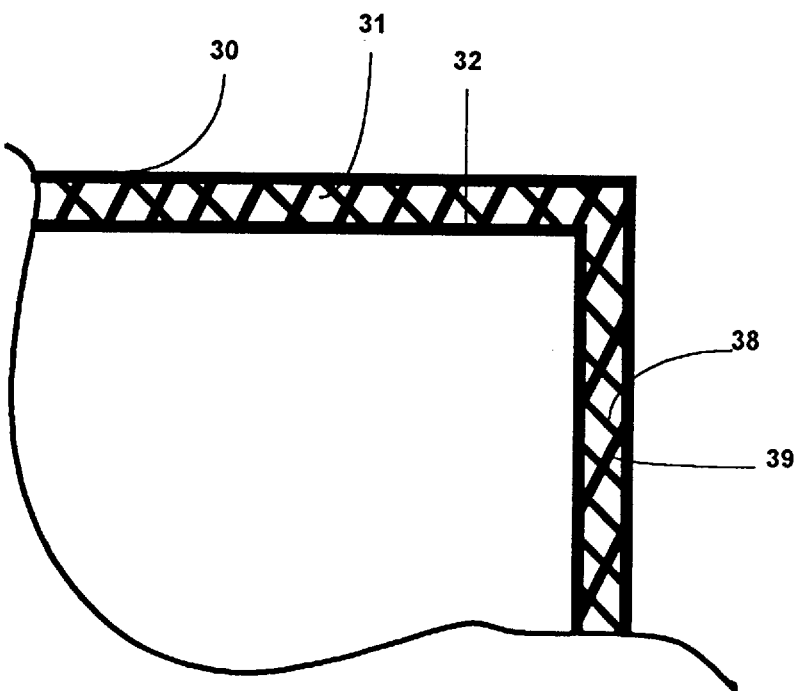

As is shown in FIG. 2, a second suggested pattern for the redundant crack stop is shown. The second pattern comprises a plurality of lines 20, 22 each of which has a plurality of fingers 24, 26, 28 extending therefrom into a space 21 between the lines 20, 22, but not connecting to the opposite line. The preferred pitch of the metal lines is from about 2 $\mu$m to about 10 $\mu$m and the preferred pitch of the fingers 24, 26, 28 is from about 1 $\mu$m to about 7 $\mu$m. This second embodiment has the benefit of directing the crack propagating energy towards the space between the two lines thereby providing an increased surface area over which the crack propagating energy may be spread.

EXAMPLE 3

In a third embodiment of the present invention, a plurality of lines 30, 32 are again provided with a space 31 therebetween. The lines are interconnected in FIG. 3A with a plurality of diagonally oriented fingers 34, 36, which extend in only one direction and in FIG. 3B with a plurality of diagonally oriented fingers 38, 39, which extend orthogonally with respect to each other, thereby forming a crosshatched configuration. Again the pitches of the metal lines and fingers are about the same as those discussed above, in Example 2, and serve the purpose of increasing the amount of area by which the crack-propagating energy may be absorbed.

EXAMPLE 4

Figure 4:
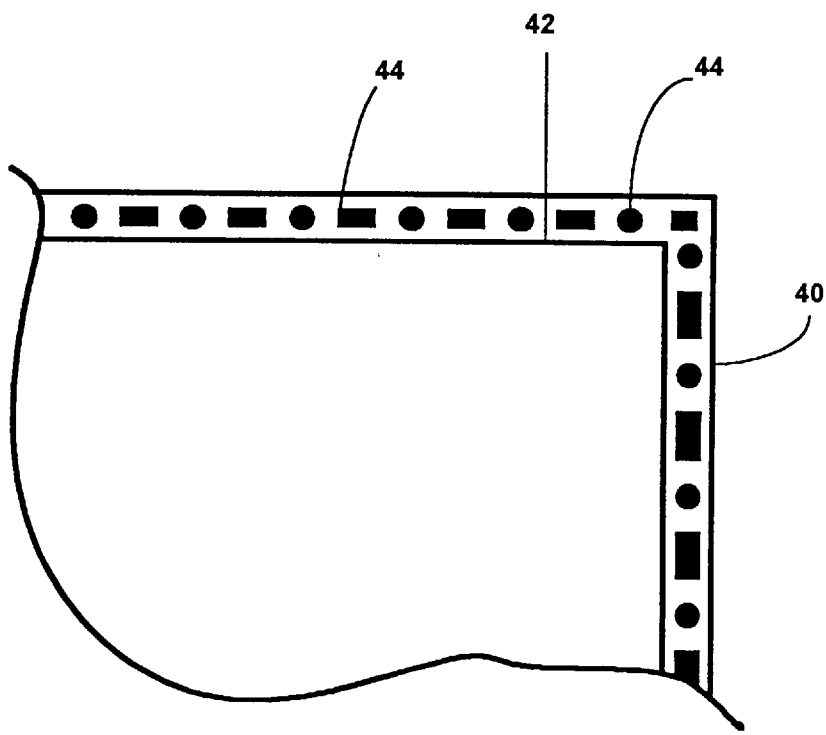
FIG. 4 is a schematic of a fourth embodiment of the present invention.

As shown in FIG. 4, a fourth embodiment, utilizing a first line 40, a second line 42, and a series of geometric shapes in a line 44 located between the first line and the second line is suggested. This embodiment is similar to the first embodiment, however, it allows the crack propagating energy to be better spread to the area between the lines rather than around the lines. Again the pitch of the metal lines is preferredly from about 1 $\mu$m to about 10 $\mu$m.

EXAMPLE 5

Figure 5:
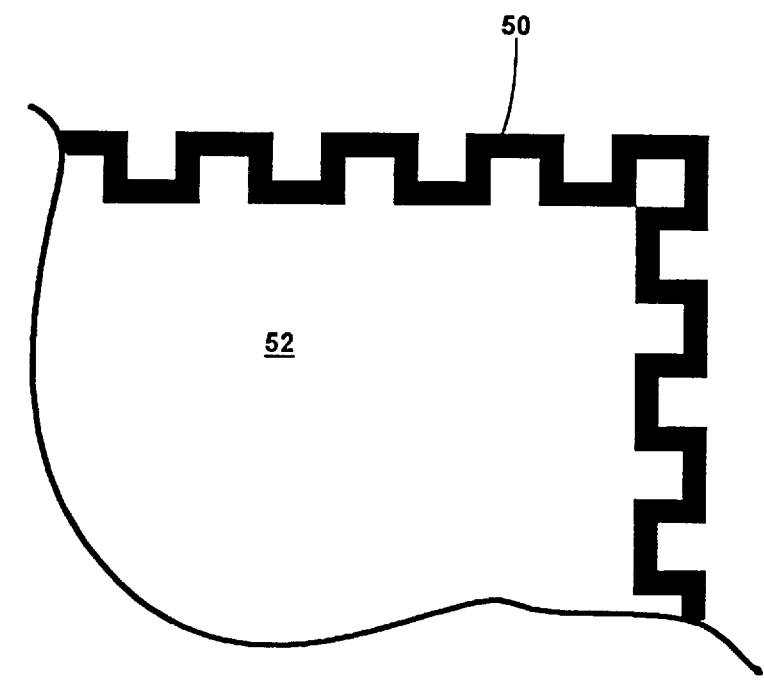
FIG. 5 is a schematic of a fifth embodiment of the present invention.

In a fifth embodiment of the present invention, a square wave shaped metallization pattern 50 is suggested, as shown in FIG. 5. More channel than you would otherwise have as well as breaking up the crack front. This pattern allows the energy that would otherwise be absorbed by a single line to be spread out over a greater area, thus reducing the likelihood of a possible crack continuing into the chip active area 52.

While the invention has been particularly shown and described with reference to preferred exemplary embodiments thereof, it will be understood by those skilled in the art that the foregoing and other changes in form and details may be made therein without departing from the spirit and scope of the invention.

Accordingly, what is claimed is:

1. An energy relieving crack stop comprising:
    at least one crack relief line, arranged around the perimeter of an active region of an individual chip, wherein the line is operatively disconnected from the active region and wherein the line includes a configuration such that a crack propagating energy is spread out over a greater amount of surface area.
2. The crack stop of claim 1, including at least a first line and a second line, whereby the crack propagating energy not absorbed by the first line may be absorbed by the second line.
3. The crack stop of claim 2, including at least three concentric square metallization lines.
4. The crack stop of claim 2, wherein the first line includes fingers extending towards the second line and the second line includes fingers extending towards the first line.
5. The crack stop of claim 4, wherein the fingers extend orthogonally from the first and second lines.
6. The crack stop of claim 4, wherein the fingers extend diagonally from the first and second lines.
7. The crack stop of claim 6, wherein the diagonally extending fingers cross, to form a cross-hatched pattern.
8. The crack stop of claim 3, wherein the first and second concentric square lines are separated by a series of geometric shapes.
9. The crack stop of claim 1, wherein the line is in the shape of a square wave.
10. The crack stop of claim 1, wherein the line is metallized.
11. An integrated circuit chip comprising:
    a chip active area having a perimeter; and
    an energy relieving crack stop comprising a line, arranged around the perimeter of, and operationally disconnected from, the chip active area, wherein the line is configured such that a crack propagating energy is spread out over a greater amount of surface area.
12. The integrated circuit chip of claim 11, including at least a first line and a second line, whereby the crack propagating energy not absorbed by the first line may be absorbed by the second line.
13. The integrated circuit chip of claim 12, including at least three concentric square metallization lines.
14. The integrated circuit chip of claim 12, wherein the first line includes fingers extending towards the second line and the second line includes fingers extending towards the first line.

15. The integrated circuit chip of claim 14, wherein the fingers extend orthogonally from the first and second lines.

16. The integrated circuit chip of claim 14, wherein the fingers extend diagonally from the first and second lines.

17. The integrated circuit chip of claim 16, wherein the diagonally extending fingers cross, to form a cross-hatched pattern.

18. The integrated circuit chip of claim 12, wherein the first and second lines are concentric squares, separated by a series of geometric shapes.

19. The integrated circuit chip of claim 11, wherein the line is in the shape of a square wave.

20. The integrated circuit chip of claim 11, wherein the line is metallized.

21. An electronic apparatus comprising an integrated circuit chip, the integrated circuit chip having:

a chip active area having a perimeter; and an energy relieving crack stop comprising a line, arranged around the perimeter of, and operationally disconnected from, the chip active area, wherein the line is configured such that a crack propagating energy is spread out over a greater amount of surface area.

22. The electronic apparatus of claim 21, the integrated circuit chip further including at least a first line and a second line, whereby the crack propagating energy not absorbed by the first line may be absorbed by the second line.

23. The electronic apparatus of claim 22, the integrated circuit chip further including at least three concentric square metallization lines.

24. The electronic apparatus of claim 22, wherein the first line includes fingers extending towards the second line and the second line includes fingers extending towards the first line.

25. The electronic apparatus of claim 24, wherein the fingers extend orthogonally from the first and second lines.

26. The electronic apparatus of claim 24, wherein the fingers extend diagonally from the first and second lines.

27. The electronic apparatus of claim 26, wherein the diagonally extending fingers cross, to form a cross-hatched pattern.

28. The electronic apparatus of claim 22, wherein the first and second lines are concentric squares, separated by a series of geometric shapes.

29. The electronic apparatus of claim 21, wherein the line is in the shape of a square wave.

30. The electronic apparatus of claim 21, wherein the line is metallized.

* * * * *

UNITED STATES PATENT AND TRADEMARK OFFICE
CERTIFICATE OF CORRRECTION

PATENT NO. : 5,834,829
DATED : Nov. 10, 1998
INVENTOR(S) : Dinkel, et al.

It is certified that error appears in the above-identified patent and that said Letters Patent is hereby corrected as shown below:

On the title page, under item [56] References Cited, insert the following:

U. S. PATENT DOCUMENTS

| EXAMINER INITIAL | | PATENT NUMBER | | | | | | | ISSUE DATE | PATENTEE | CLASS | SUBCLASS | FILING DATE IF APPROPRIATE |
|---|---|---|---|---|---|---|---|---|---|---|---|---|---|
| | | 3 | 6 | 2 | 8 | 1 | 0 | 7 | 12/14/71 | Kennedy | | | |
| | | | | | | | | | | | | | |

FOREIGN PATENT DOCUMENTS

| | | DOCUMENT NUMBER | | | | | | | PUBLICATION DATE | COUNTRY OR PATENT OFFICE | CLASS | SUBCLASS | TRANSLATION YES | NO |
|---|---|---|---|---|---|---|---|---|---|---|---|---|---|---|
| | | EP | 0 | 80 | 67 | 9 | 5 | A2 | 12/11/97 | Europe | | | | |
| | | EP | 0 | 60 | 58 | 0 | 6 | A2 | 09/12/93 | Europe | | | | |

Signed and Sealed this

Thirteenth Day of April, 1999

*Attest:*

Q. TODD DICKINSON

*Attesting Officer*  Acting Commissioner of Patents and Trademarks